US008870513B2

(12) United States Patent
Voser et al.

(10) Patent No.: US 8,870,513 B2
(45) Date of Patent: Oct. 28, 2014

(54) VACUUM TREATMENT APPARATUS

(75) Inventors: Stephan Voser, Grabs (CH); Gerhard Dovids, Maienfeld (CH)

(73) Assignee: Oerlikon Advanced Technologies AG, Balzers (LI)

( * ) Notice: Subject to any disclaimer, the term of this patent is extended or adjusted under 35 U.S.C. 154(b) by 354 days.

(21) Appl. No.: 13/257,001

(22) PCT Filed: Mar. 11, 2010

(86) PCT No.: PCT/EP2010/053140
§ 371 (c)(1),
(2), (4) Date: Sep. 16, 2011

(87) PCT Pub. No.: WO2010/105967
PCT Pub. Date: Sep. 23, 2010

(65) Prior Publication Data
US 2012/0003064 A1    Jan. 5, 2012

Related U.S. Application Data

(60) Provisional application No. 61/161,084, filed on Mar. 18, 2009.

(51) Int. Cl.
*H01L 21/677* (2006.01)
*H01L 21/67* (2006.01)

(52) U.S. Cl.
CPC .... *H01L 21/67736* (2013.01); *H01L 21/67201* (2013.01); *H01L 21/67748* (2013.01); *H01L 21/67751* (2013.01); *Y10S 414/139* (2013.01)
USPC ................. 414/217; 414/222.13; 414/226.05; 414/744.2; 414/939; 198/608

(58) Field of Classification Search
CPC ................... H01L 21/67727; H01L 21/67736

USPC ............ 414/217, 222.13, 226.05, 744.2, 939; 198/576, 598, 608
See application file for complete search history.

(56) References Cited

U.S. PATENT DOCUMENTS 1,281,579 A * 10/1918 Johnson ........................ 198/357
1,846,009 A *  2/1932 White et al. ............... 198/477.1
(Continued)

FOREIGN PATENT DOCUMENTS

JP    2008-013851 A    1/2008
JP    2008-153353 A    7/2008
(Continued)

OTHER PUBLICATIONS

International Search Report for PCT/EP2010/053140 dated Apr. 12, 2011.

(Continued)

*Primary Examiner* — James Keenan
(74) *Attorney, Agent, or Firm* — Pearne & Gordon LLP

(57) ABSTRACT

A transport arrangement (100) for bi-directionally transporting substrates towards and from a load lock (5) comprises a first substrate handler (1) swivelable about a first axis ($A_1$) and with at least two first substrate carriers (1a, 1b). A second substrate handler (20) swivelable about a second axis ($A_{20}$) comprises at least four second substrate carriers (20a to 20d). First and second substrate carriers are mutually aligned respectively in one position of their respective swiveling trajectory paths as one of the first substrate carriers is aligned with one of the second substrate carriers and the other of the first substrate carriers is aligned with the load lock (5). The first substrate carriers (1a, 1b) are movable towards and from the load lock (5) once aligned there with and thereby form respectively external valves of the load lock (5).

20 Claims, 8 Drawing Sheets

(56) References Cited

U.S. PATENT DOCUMENTS

| | | | |
|---|---|---|---|
| 2,888,131 A * | 5/1959 | Allen | 198/680 |
| 3,563,170 A * | 2/1971 | Cvacho et al. | 101/40 |
| 3,712,450 A * | 1/1973 | Hurst | 198/471.1 |
| 3,915,117 A * | 10/1975 | Schertler | 118/719 |
| 4,969,790 A * | 11/1990 | Petz et al. | 414/217 |
| 5,033,927 A * | 7/1991 | Pelissier | 414/217 |
| 5,158,168 A * | 10/1992 | Bedin | 198/465.1 |
| 5,232,505 A * | 8/1993 | Novak et al. | 118/712 |
| 5,405,230 A * | 4/1995 | Ono et al. | 414/217 |
| 5,451,130 A * | 9/1995 | Kempf | 414/27 |
| 5,743,965 A * | 4/1998 | Nishimura et al. | 118/712 |
| 5,863,170 A * | 1/1999 | Boitnott et al. | 414/222.13 |
| 5,913,652 A * | 6/1999 | Zejda | 414/226.01 |
| 6,241,824 B1 * | 6/2001 | Brauer et al. | 118/730 |
| 6,270,619 B1 * | 8/2001 | Suzuki et al. | 156/345.22 |
| 6,702,540 B2 * | 3/2004 | Olin | 414/217 |
| 6,818,108 B2 * | 11/2004 | Schertler | 204/298.25 |
| 7,066,703 B2 * | 6/2006 | Johnson | 414/217 |
| 7,942,256 B2 * | 5/2011 | Coates | 198/608 |

FOREIGN PATENT DOCUMENTS

| | | |
|---|---|---|
| WO | 02/23597 A2 | 3/2002 |
| WO | 2007/126289 A1 | 11/2007 |
| WO | 2007/129838 A1 | 11/2007 |

OTHER PUBLICATIONS

Written Opinion for PCT/EP2010/053140 dated Apr. 12, 2011.

* cited by examiner

VACUUM TREATMENT APPARATUS

BACKGROUND OF THE INVENTION

The present invention is directed on a vacuum treatment apparatus for single substrate treatment. For vacuum treatment apparatus operating in single substrate treatment mode, in opposition to batch treatment mode, the criteria
footprint of the apparatus
throughput by the apparatus
accessibility to subsets of the apparatus from ambient atmosphere
coupled with the last mentioned criterion, time intervals during which the apparatus is unproductive e.g. for maintenance and replacement works are of utmost importance.

It is an object of the present invention to provide a vacuum treatment apparatus which is optimized for the above mentioned criteria.

BRIEF SUMMARY OF THE INVENTION

This is achieved by the vacuum treatment apparatus which comprises a vacuum treatment recipient. The vacuum treatment recipient comprises a load lock between an inside of the recipient and exterior of the recipient which is customarily ambient. The load lock comprises an external valve arrangement which operates between a compartment of the load lock and the exterior of the treatment recipient. The load lock further comprises an internal valve arrangement which operates between the compartment of the load lock and the remainder of the inside of vacuum treatment recipient. The load lock is conceived as a bi-directional load lock for substrate transfer between the interior and the exterior of the vacuum treatment recipient.

The vacuum treatment apparatus according to the invention further comprises a transport arrangement which is located in the exterior for bi-directionally transporting substrates towards and from the load lock. The addressed transport arrangement comprises
  a first substrate handler which is swivelable about a first axis by means of a controlled first drive and which comprises at least two first substrate carriers equally spaced from the addressed first axis,
  a second substrate handler which swivelable about a second axis by means of a second controlled drive and which comprises at least four second substrate carriers which are equally spaced from the second axis.

The first and the second substrate carrier are mutually aligned respectively in one specific position of their respective swiveling trajectory paths. As one of the first substrate carriers is aligned with one of the second substrate carriers, the other one of the first substrate carriers is aligned with the load lock. The first substrate carriers are further moveable towards and from the vacuum treatment recipient, once one of these substrate carriers is aligned with the load lock. They are moveable as addressed by respective third controlled drives and thereby form, respectively, the external valve of the load lock.

By this addressed transport arrangement there is realized a bi-directional transport ability, by which untreated substrates may be conveyed from a source location towards and into the vacuum treatment recipient as well as, vice versa, treated substrates from the vacuum treatment recipient towards and onto a destination location. Thereby, due to the combination of these bi-directional transport abilities towards and from the vacuum treatment recipient, considerable footprint area is saved. In spite of this combination of forwards and backwards trajectory paths for the substrates with respect to the load lock in the vacuum treatment recipient a high transport capacity and thus throughput is realized. Additionally, all the transport arrangement is built in the exterior area with respect to the vacuum treatment recipient, which allows easy accessibility.

In one embodiment of the apparatus according to the present invention the load lock has a serving opening for substrates towards the exterior of the vacuum recipient, which is located in a top side wall portion of the vacuum treatment recipient. This allows within the vacuum recipient, to have the substrate just deposited on any type of substrate carrier ability. Only the first substrate handler with a minimal number of substrate carriers has to be tailored to hold the substrates in suspended position, necessitating active substrate retention abilities.

In a further embodiment of the apparatus according to the invention the first substrate handler has just two of the first substrate carriers which are located opposite each other with respect to the first axis, i.e. the swiveling axis of the first substrate handler. This allows to swivelably control the first handler for serving on one hand the load lock, on the other hand the second substrate handler in equal angular swiveling steps.

Still in a further embodiment of the apparatus according to the invention which may be combined with any of the already and subsequently addressed embodiments of such apparatus the second substrate handler comprises just four of the second substrate carriers arranged pairwise opposite each other with respect to the second axis, i.e. the swiveling axis of the second substrate handler. Thereby, the second substrate handler provides for the necessary intermediate storage location for an untreated and a treated substrate to allow bi-directional transport ability of the transport arrangement, but, on the other hand, minimizes the footprint area without reducing throughput.

In a further embodiment of the apparatus according to the invention, which may be combined with any of the already and subsequently addressed embodiments, the first and second axes as well as the direction of moveability of the first substrate carriers towards and from the vacuum treatment recipient, i.e. the moveability for load lock valve action of the first substrate carriers, are parallel. Especially in combination with the specific location of the serving opening of the load lock this embodiment leads to a highly efficient and compact overall construction wherein transfer of substrates between the handlers one hand and between the first handler and the load lock, finally the vacuum treatment recipient, may be performed with minimal expenditures. Only a minimal number of the substrate carriers needs to be tailored for suspendingly holding substrates, whereas the remaining substrate carriers may just support the substrate deposited thereon. Only fixation of the substrates on the latter substrate carriers with respect to centrifugal forces must be provided in view of the high velocity swiveling of the respective substrate handlers.

In a further embodiment of the apparatus according to the invention which again may be combined with any of the already and subsequently addressed embodiments the vacuum treatment recipient comprises at least two mounting locations for a treatment station each. Thus, in minimal configuration two treatment stations may be mounted to the vacuum treatment recipient besides of the load lock addressed before. Each of the treatment stations is conceived for treating a single substrate. The vacuum treatment recipient further comprises a further transport arrangement which is swivelable about a third axis by means of a controlled third drive.

The further transport arrangement comprises at least three substrate supports equally spaced from the swiveling axis of the further transport arrangement. Thus, the at least three substrate supports are in fact arranged along a circular locus about the addressed third axis. The substrate supports are further evenly distributed in azimutal direction with respect to the swiveling axis of the further transport arrangement, which means that radial loci between the addressed axis and the respective substrate supports define for equal angles, in the minimal configuration of 120°.

By providing the addressed vacuum treatment recipient with the one bi-directional load lock, substrates are input through the load lock, transported subsequently to all mounting locations for a treatment station and finally unloaded from the recipient towards the transport arrangement stepwise. Step timing control of the further transport arrangement and thus of overall substrate processing governs the swivel step control of the first and second substrate handlers. As all the treatment steps by treatment stations mounted to the addressed mounting location are of equal duration, processing steps with longer processing durations are split in sub-process steps, each performed at one of the treatment stations. E.g. in one extreme, if substrate processing necessitates a processing time which accords with three time the time span one substrate is exposed to one treatment station in the vacuum recipient, then all the treatment stations provided are selected be equal and to be operated equally.

Thus, by the addressed embodiment a high processing flexibility is reached, nevertheless ensuring a minimal footprint for the overall apparatus and high throughput.

In a variant of the just addressed embodiment the third axis which is the swiveling axis of the further transport arrangement is parallel to the first axis, i.e. the swiveling axis of the first substrate handler.

Still in a further embodiment of the apparatus according to the invention, which may be combined with any of the already and subsequently addressed embodiments and variants, there is provided a one-directional conveyor which interacts with respect to substrate transport with the second substrate handler. Taking into account that the transport arrangement of the apparatus according to the invention is a bi-directional transport arrangement, it might be seen that it is possible to unload an untreated substrate from the one-directional conveyor and to replace it there by an already treated substrate. Thereby, a highly efficient inline treatment of substrates becomes possible, wherein the substrates which are transported one-directionally become treated and are treated downstream a position of substrate transfere between the one-directional conveyor and the transport arrangement handlers.

In one variant of the embodiment as just addressed the one-directional conveyor interacts with the second substrate handler by means of a third substrate handler. This allows establishing substrate support on the one-directional conveyor so that there no active substrate holder arrangements are necessary as would be necessary if the substrates were to be held in suspended position at the addressed conveyor.

According to the present invention there is further provided an enlarged vacuum treatment apparatus which comprises at least two of the vacuum treatment apparatus and wherein the addressed one-directional conveyor for each of the addressed vacuum treatment apparatus is realized by a single one-directional conveyor. Thereby and due to the more than one of the addressed vacuum treatment apparatus along the one-directional conveyor processing flexibility is even largely improved. On one hand the number of overall treatment stations is risen generically and it becomes possible by equally treating substrates at both the addressed apparatus to perform parallel processing and thereby to significantly increase throughput.

In one variant of the just addressed enlarged vacuum treatment apparatus according to the invention a flip station is provided between two of the vacuum treatment apparatus arranged along the one-directional conveyor, wherein the substrates treated by a first of the addressed apparatus are turned upside down, allowing the other side of the substrates to be treated in the second, downstream apparatus, thus overall allowing double-sided substrate treatment.

The apparatus or enlarged apparatus according to the invention is especially suited for treating substrates of at least 200 mm×200 mm and is further especially suited for high throughput manufacturing of solar cells.

BRIEF DESCRIPTION OF THE DRAWINGS

The invention shall now be further explained by means of examples and with the help of figures. The figures show.

DETAILED DESCRIPTION OF THE INVENTION

Figure 1:
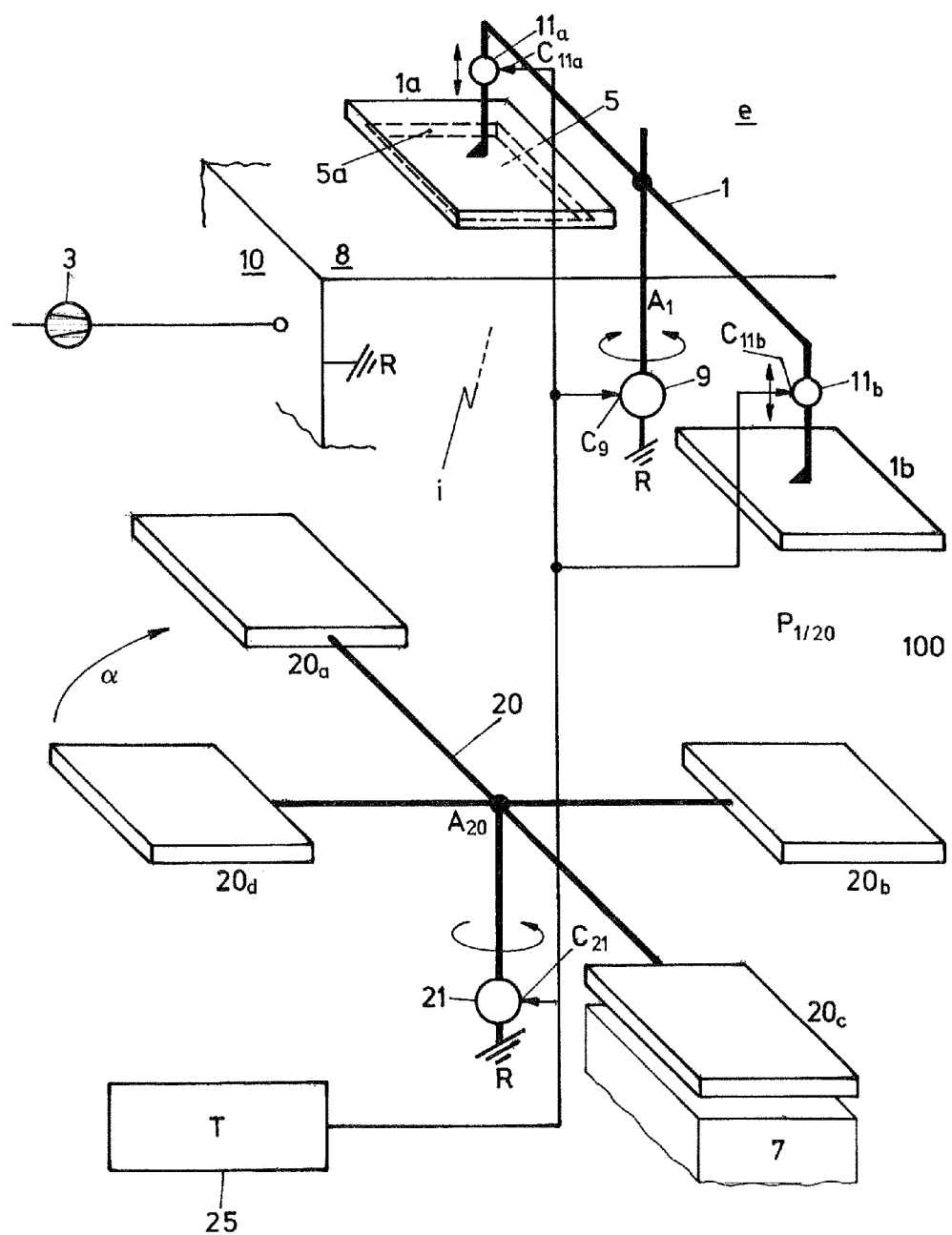
FIG. 1 most schematically in a perspective representation, an apparatus according to the present invention.

In FIG. 1 an apparatus according to the present invention is perspectively shown, most schematically and under a generic approach. Substrates (not shown in FIG. 1) are treated by one or more than one vacuum treatment processes within a vacuum recipient 10 which is evacuatable by means of a vacuum pump arrangement 3. The vacuum recipient 10 has an interior volume i and is surrounded by its exterior e which is e.g. ambient atmosphere. The vacuum recipient 10 has a pass-through opening in its top wall 8 for substrates. The pass-through opening is conceived as a bi-directional load lock 5 having an external valve plate 1a, an internal valve (not shown in the representation of FIG. 1) as clearly known to the skilled artisan and a load lock compartment 5a. The external valve plate 1a is realized by a substrate carrier 1a which is provided on a first substrate handler 1 of a transport arrangement 100 provided in the exterior e of the vacuum treatment recipient 10. The first substrate handler 1 is swiveable about a first axis $A_1$, whereby the swiveling movement is driven by a first drive 9 which is controllable at a control input $C_9$. The first substrate handler 1 comprises two first substrate carriers $1_a$ and $1_b$ which are mounted on the addressed handler radially opposite to each others with respect to the first axis $A_1$ and equally spaced from this first axis $A_1$. As the first substrate handler 1 is controllably swiveled about axis $A_1$, selectively one of the at least two first substrate carriers $1_a$ and $1_b$ becomes positioned in registry with the compartment 5a of load lock 5, as shown in FIG. 1 the one first substrate carrier $1_a$.

Each of the at least two first substrate carriers 1a and 1b, once aligned with load lock 5, may be moved towards the vacuum treatment recipient 10 and thus towards compartment 5a of load lock 5 to seal off the addressed compartment with respect to the exterior e and thus to operate as the external valve of the load lock 5. Because in the embodiment of FIG. 1 the opening of load lock 5 towards the exterior e is in plane with the plane wherealong the first substrate carrier 1 swivels, the first substrate carriers 1a and 1b as of FIG. 1 are moveable towards and from such opening in a direction parallel to first axis $A_1$, driven by control drives $11_a$ and $11_b$, both being controlled via respective control inputs $C_{11a}$ and $C_{11b}$. The transport arrangement 100 further comprises a second substrate handler 20 which is swivelable about a second axis $A_{20}$ by means of a second controlled drive 21 controlled at a control input $C_{21}$. The second substrate handler 20 comprises at least four second substrate carriers $20_a$ to $20_d$. The second substrate carriers $20_a$ to $20_d$ are evenly distributed in azimutal direction $\alpha$ with respect to the second axis $A_{20}$ about this axis $A_{20}$ and are equally spaced therefrom.

In the embodiment as shown in FIG. 1 the second axis $A_{20}$ is parallel to the first axis $A_{10}$ which generically is not mandatory.

Considered along their respective swiveling trajectory paths the first substrate carriers 1a and 1b and the second substrate carriers $20_a$ to $20_d$ are mutually aligned respectively in one position $P_{1/20}$, in the embodiment of FIG. 1 considered in direction of the axis $A_1$ and $A_{20}$. Whenever one of the first substrate carriers 1a and 1b is aligned with one of the second substrate carriers $20_a$ to $20_d$ the other one of the two first substrate carriers 1a and 1b, according to FIG. 1 first carrier 1a, is in alignment with the load lock 5 and establishes there for the external valve of the load lock 5.

At the references R the mechanic, customarily stationary reference system is addressed.

The first and the second substrate carriers 1a, 1b; 20a-20d are respectively equipped (not shown in FIG. 1) with substrate seizing or gripping and releasing arrangements, which arrangements are controlled if necessary.

Clearly, such substrate seizing or gripping and releasing arrangement is differently conceived dependent therefrom, whether at a respective substrate carrier a substrate will be suspended and thus is to be lifted and held against force of gravity or at another respective substrate carrier the substrate may rather be deposited thereon.

By such controlled arrangements which e.g. may be electromagnetically based, magnetically based or may be realized by vacuum chucks at a respective substrate carrier a substrate may be seized from a support or released to a support.

The apparatus as generically shown in FIG. 1 further comprises a timing unit 25 by which all the controlled drives 11a, 11b, 9 and 21 as well as the (not shown) substrate seizing and releasing units at the first and/or second substrate carriers are time controlled.

As was addressed, the load lock 5 of the vacuum recipient 10, wherein substrate vacuum treatment is performed, is conceived as a bi-directional load lock, which means substrates are transferred from the exterior e to the interior i of the vacuum treatment recipient 10 as well as vice versa from the interior i to the exterior e via load lock 5. Further and as will be exemplified, the transport arrangement 100 is operated by respective time sequence control of the addressed drives and seizing/releasing units as a bi-directional transport arrangement for substrates which are to be treated towards and into the vacuum recipient 10 as well as for substrates which have been treated in vacuum recipient 10 towards a desired destination, generically shown at 7.

Such bi-directional transport becomes possible by the transport arrangement as generically shown in FIG. 1, by which in combination with the bi-directional ability of load lock 5, considerable foot print area of the overall apparatus is saved. This due to the fact that one and the same transport arrangement acts as a transport arrangement for both, treated as well as untreated substrates.

A specific manner of time control of the transport arrangement 100 for bi-directionality shall now be exemplified with the help of FIGS. 2a to 2f.

Figure 2A:
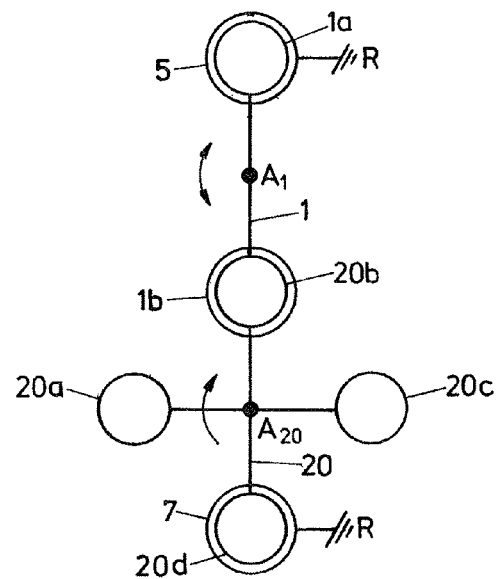
FIG. 2 schematically, an apparatus according to FIG. 1 in top view for explaining by means of FIG. 2b-FIG. 2f a step-by-step control of the transport arrangement of the apparatus according to FIG. 1.

In FIGS. 2a to 2f a step sequence of substrate handling by the apparatus according to FIG. 1 is shown. Thereby, the apparatus which is shown perspectively in FIG. 1 is schematically shown in FIG. 2a in top view, whereby the substrate carriers exemplified in FIG. 1 in square shape are shown in FIG. 2a in circular shape. Further, it has to be noted that substrates UT not yet treated in vacuum recipient 10 are addressed by one type of hatching according (UT) and substrates T having been treated in vacuum recipient 10 are denoted by the other type of hatching (T). It has further to be noted that in each step representation transition of the respective substrates between first and second substrate carriers 1a, 1b and 20a to 20d respectively and between a source and a destination location 7 and second substrate carriers 20a to 20d as well as between an inside transport within vacuum recipient 10 (not shown in FIG. 1) and the first substrate carrier 1a and 1b has already been completed.

FIG. 2a shows the respective swiveling directions which are assumed for the following step-by-step discussion.

Figures 2B, 2C:
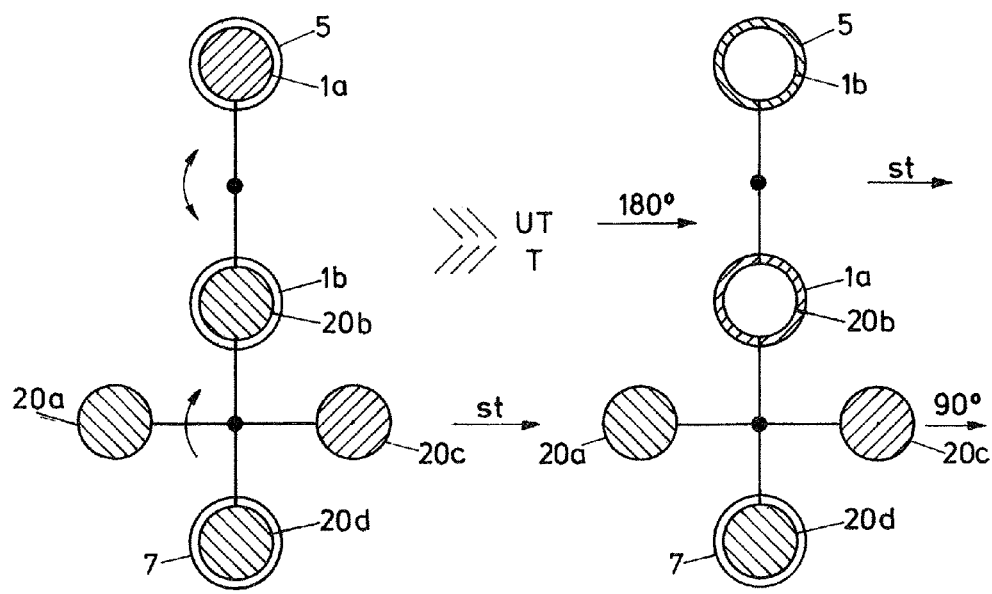

To FIG. 2b:

Substrate carrier 20d has been loaded with an untreated substrate from source location 7. Substrate carrier (SC) 20a is loaded with an untreated substrate.

SC 20b has unloaded an untreated substrate to SC 1b.

SC 1a has been loaded with a treated substrate from load lock 5.

SC 20c is still loaded with a treated substrate.

To FIG. 2c:

In transiting from the FIG. 2b to the FIG. 2c representation the first substrate handler 1 is swiveled by 180°, whereas the second substrate handler 20 is kept stationary. SC 1b has unloaded the untreated substrate to load lock 5. The treated substrate on SC 1a has been unloaded to SC20b. Untreated substrates still remain on SC20d and SC20a, whereas SC20c is still loaded with a treated substrate.

Figures 2D, 2E:
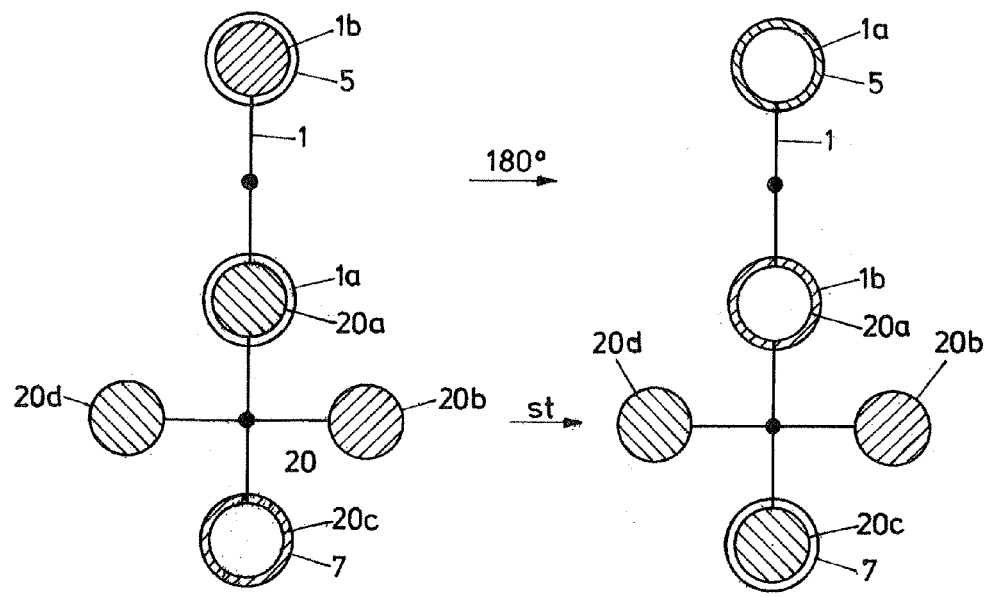

To FIG. 2d:

When transiting from the configuration according to FIG. 2c to the configuration according to FIG. 2d the first substrate handler 1 is kept stationary, whereas the second substrate handler 20 is swiveled by 90°.

SC1b is loaded from load lock 5 by a treated substrate. SC1a is loaded with an untreated substrate from SC20a. SC20c has unloaded a treated substrate to destination location 7.

SC20d is still loaded with an untreated substrate, whereas SC20b is still loaded with a treated substrate.

To FIG. 2e:

By transiting from the configuration according to FIG. 2d to the configuration according to FIG. 2e the first substrate handler 1 is swiveled by 180°, whereas the second substrate handler 20 is kept stationary.

SC1a has unloaded the untreated substrate to load lock 5. SC1b has unloaded a treated substrate to SC20a. SC20c has been loaded by an untreated substrate from source destination 7.

SC20d is still loaded with an untreated substrate, whereas SC20b is still loaded with a treated substrate.

Figure 2F:
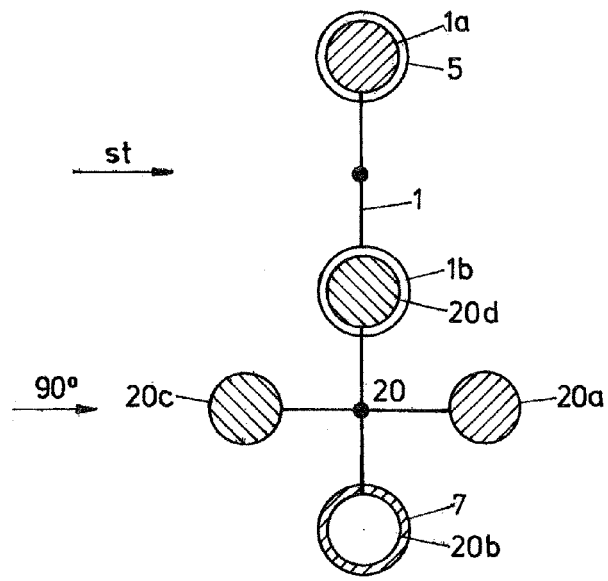

To FIG. 2f:

When transiting from the configuration of FIG. 2e to the configuration of FIG. 2f the first substrate handler 1 is kept stationary, whereas the second substrate handler 20 is swiveled by 90°.

SC1a is loaded from load lock 5 with a treated substrate.

SC1b is loaded from SC20d with an untreated substrate. SC20b has unloaded a treated substrate to source destination 7.

SC20c is still loaded with an untreated, whereas SC20a is still loaded with a treated substrate.

As may be seen, the configurations e.g. of FIG. 2c and FIG. 2e on one hand and of FIG. 2d and FIG. 2f on the other hand are identical.

It might be seen that within one working cycle consisting of subsequent swivel step of substrate handler 1 and swivel step of substrate handler 20, one treated substrate is transferred from vacuum treatment recipient 10 to the transport arrangement 100 and one untreated substrate is delivered from the transport arrangement 100 to the vacuum treatment recipient 10. At the other end of the transport arrangement 100 one untreated substrate is picked up from a source station 7 and one treated substrate is delivered to reception station 7.

By the arrangement as exemplified in FIG. 1 there is thus achieved in a highly small footprint configuration a bi-directional substrate transport from a source of untreated substrates towards and into a vacuum treatment recipient, and from such vacuum treatment recipient towards and to a reception location for treated substrates.

With an eye on the FIGS. 1 to 2e it further might be seen that the principle as exemplified is not necessarily bound to the substrates being delivered to and retrieved from a vacuum recipient at its top side and by respective vertical movement of the first substrate carriers 1a or 1b, simultaneously acting as the exterior valve of the bi-directional load lock 5. Further, it becomes evident that the swivel axes $A_1$ and $A_{20}$ need not necessarily be vertical and need not necessarily be in parallelism, and further it becomes evident that with respect to the location of the vacuum treatment recipient 10 the two substrate handlers 1 and 20 might be arranged in inverse sequence. Further, it becomes evident that the handler 20 which in fact provides for an intermediate storage location both for an untreated and for a treated substrate might be realized with more than four substrate carriers and that the first handler 1 as well might be realized with more than two first substrate carriers. Further, under a generic aspect it is further not mandatory that, considered in azimutal direction α in FIG. 1, the substrate carriers as provided at both substrate handlers 1 and 20 are equally distributed. They might be distributed unevenly, which would only necessitate respective control of differently sized swiveling steps.

Nevertheless and with an eye on one object of the present invention, namely to provide an optimally small footprint, high throughput vacuum treatment apparatus, the following prevails:

Providing the input/output of substrates to and from the vacuum treatment apparatus as shown in FIG. 1, which means at a top surface of the vacuum recipient 10 and providing a vertical transfer movement and movement of the external load lock valve significantly facilitates handling of the substrates within the treatment apparatus, as such substrates may just be deposited upon a handler within the recipient 10.

Conceiving the first substrate handler 1 with only two substrate carriers 1a and 1b necessitates only two of these carriers being tailored to additionally act as an external load lock valve for load lock 5.

Further, as only two substrate carriers 1a and 1b are provided at the first substrate handler 1, only two equipments must be provided to lift and to hold substrates against the force of gravity.

Conceiving the second substrate handler 20 with not more than four substrate carriers ensures the intermediate storage location for just one of the untreated and of the treated substrates, which minimizes the footprint area for such handler. Providing more than the addressed four substrate carriers 20a to 20d will not improve throughput, but will—especially for large substrates—significantly increase footprint area.

Realizing the sequence of the two handlers, considered from the vacuum treatment recipient 10 as shown in FIG. 1, minimizes, as was addressed above, the number of substrate carriers to be additionally tailored and equipped so as to act as external load lock valves.

Thereby, that substrate handler with more than two substrate carriers additionally allows for significant simplification of substrate holding equipment upon the substrate carriers, because the substrates will be just deposited on top of the addressed carriers.

The equal distribution of the substrate carriers along their respective swiveling paths, i.e. azimutally, significantly simplifies control of the swiveling drives 9 and 21 and the mutual arrangement of the handlers and the vacuum treatment recipient which is also valid for the arrangement as shown in FIG. 1 for the swiveling axes $A_1$ and $A_{20}$.

Thus, it might be seen that the embodiment as shown in FIG. 1 is in fact highly optimized with respect to easy substrate handling, high throughput and small footprint.

Figure 3:
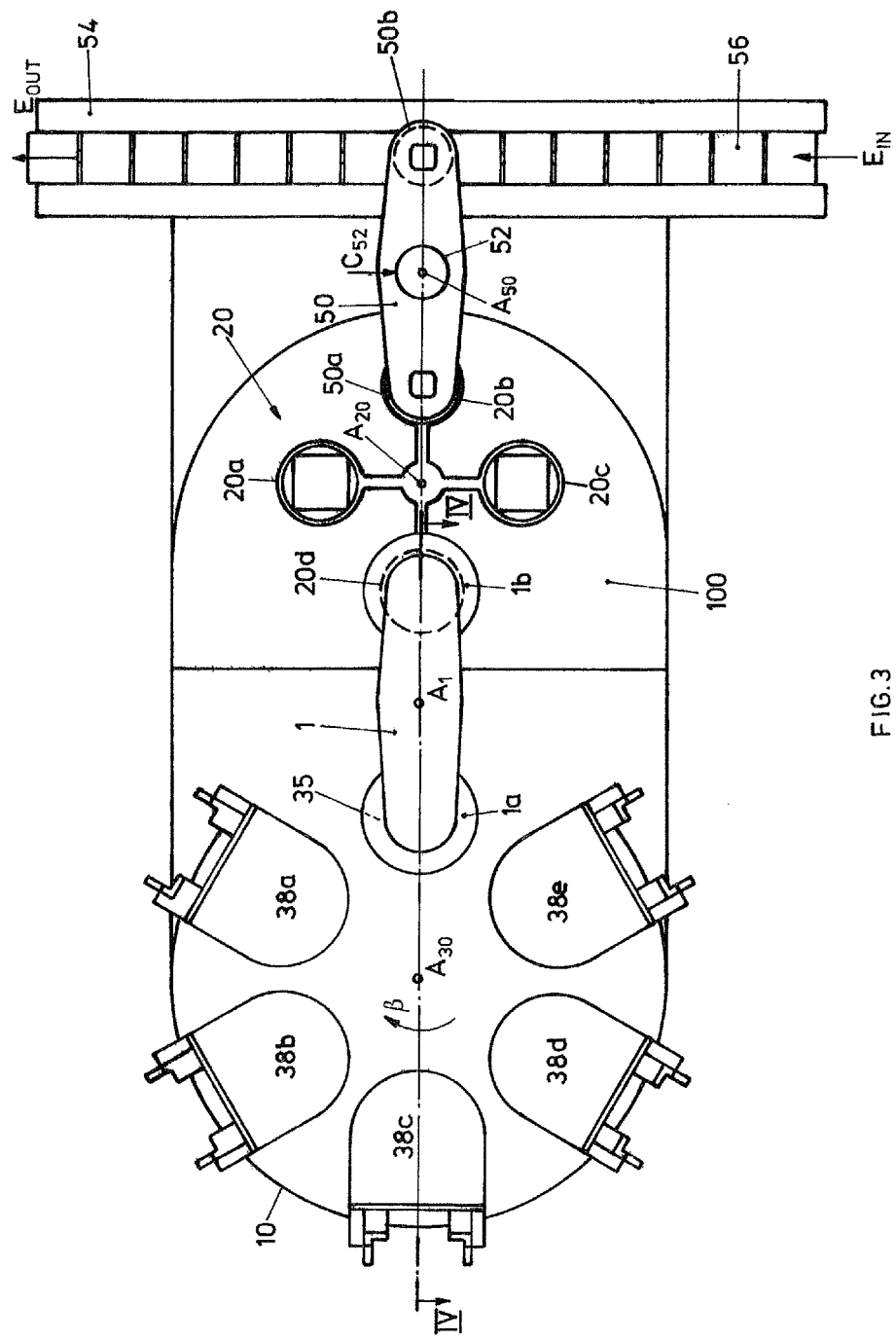
FIG. 3 in top view, an embodiment of the apparatus according to the present invention incorporating therein the apparatus as exemplified with the help of FIGS. 1 and 2.
Figure 4:
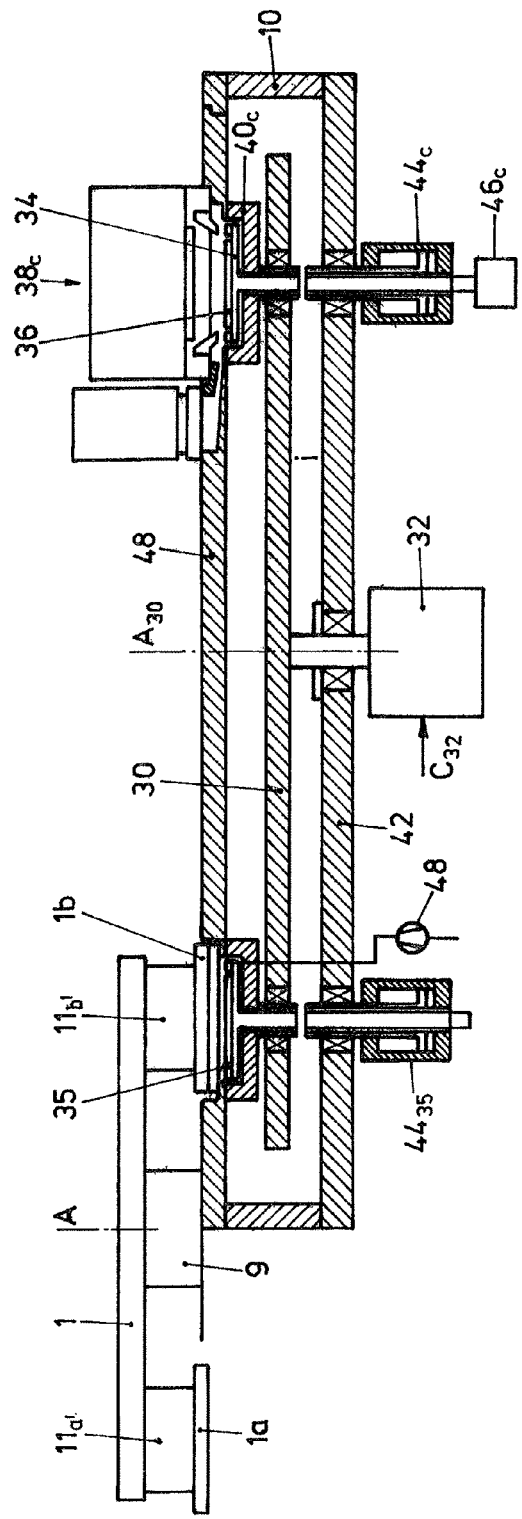
FIG. 4 a part of the apparatus according to FIG. 3 in cross-sectional representation.

FIG. 3 shows in top view and simplified a today preferred vacuum treatment apparatus according to the invention, wherein the transport arrangement 100 in cooperation with a vacuum treatment recipient 10 as shown in FIG. 1 are exploited. FIG. 4 shows a cross-sectional representation along line IV-IV of FIG. 3, without handler 20.

Within vacuum recipient 10 there is provided as seen in FIG. 4 a transport arrangement 30 which is swivelable about a central axis $A_{30}$. The transport arrangement 30 is driven for its swivel movement by a drive 32 with a control input $C_{32}$. As seen from FIG. 4 in combination with FIG. 3 in this specific embodiment the transport arrangement 30 carries along its periphery six substrate carriers 34 for substrates 36. On top of the vacuum treatment recipient 10 there are provided six stations, five of which, 38a to 38e, being surface treatment stations for the substrates 36, one thereof being the bi-directional load lock station 35 in analogy to load lock 5 of FIG. 1. The surface treatment stations 38a to 38e may all be realized for different substrate processings or a number of these treatments stations may be conceived for equal surface processing and even all of these stations may be conceived for equal substrate surface processing. Such treatment stations may be stations for PVD surface treatment, e.g. sputtering stations for reactive or non-reactive sputtering, thereby especially magnetron sputtering, may be stations for arc evaporation coating, again reactive or non-reactive, may further be treatment stations for CVD, thereby especially for plasma-enhanced CVD, may further be etching stations, heating or cooling stations, etc.

As especially seen in FIG. 4 the respective substrate carriers 34 reside within inner valve members, one thereof, $40_c$, being shown in FIG. 4. In positions registering with the positions of the treatment stations 38a to 38e as well as with the position of load lock 35, there are provided, mounted to the bottom wall 42 of the vacuum treatment recipient 10, cylinder/piston arrangements, respectively $44_a$ to $44_e$ and $44_{35}$.

By means of the cylinder/piston arrangements 44, in fact double-piston arrangements, the substrate carriers 34 and the valve members 40 may be lifted and retracted independently. Thus and with an eye on FIG. 4, by the cylinder/piston arrangement $44_c$ the substrate carrier 34 may be lifted into treatment position for substrate 36 within treatment station $38_c$. Simultaneously, if needed, the processing space within the treatment station $38_c$ is sealed from the remaining interior i of the vacuum treatment recipient 10 by means of lifting the valve member $40_c$ towards and onto wall 48 of the vacuum treatment recipient 10.

If desired for specific substrate treatment at specific treatment stations and as exemplified for the treatment station $38_c$ in FIG. 4, there is further provided a controlled rotary drive $46_c$ by means of which, once the respective substrate carrier 34 is brought into registering position with a treatment station 38, the substrate carrier 34 is rotated in its treatment position e.g. to establish uniform treatment along the surface of the substrate.

Thus, in operation the transport arrangement 30 is stepwise rotated by respective angular steps β as shown in FIG. 3 so that after each angular swiveling step one of the valve member 40 and substrate carriers 34 is in registering position with one of the treatment stations 38 and load lock 35. Then in the registering positions, seal-off of the treatment or processing atmosphere from the inside i of the vacuum treatment recipient 10 is established by lifting the valve member 40 towards and onto the inner surface of the top wall 48 of the vacuum treatment recipient 10, thereby the substrate carriers 34 are lifted in respective processing positions within the treatment stations 38. Lifting of the substrate carriers 34 on one hand and of valve members 40 on the other hand is performed substantially simultaneously at each of the treatment stations.

That valve member 40 which registers with the load lock 35 acts as the inside load lock valve. The substrate handler 1 with swiveling drive 9 is conceived as was explained in context with FIG. 1. Thereby, the drives $11_a$ and $11_b$ as shown in FIG. 1 are realized by respective cylinder/piston drives $11_{a'}$ and $11_{b'}$. A load lock vacuum pump 48 is operationally connected to the load lock compartment of the load lock 35.

Further and as may be seen from FIG. 3 the second substrate handler 20 is conceived as was exemplified more schematically in the FIGS. 1 to 2f.

As may be seen from FIGS. 2b to 2f occurrence of step forwards movement of the transport arrangement 30 and occurrence of 180° swiveling steps of the first substrate handler 1 are in synchronism, but phase shifted by half a step repetition period. Thus, the step control clock for the transport arrangement 30 which depends from the respective processing durations at the treatment stations 38, governs the swiveling clock for handler 1.

For each of the processing or treatment steps performed at the treatment stations 38a to 38e an equal duration is established which accords with the duration which is necessitated to remove a treated substrate from the transport arrangement 30 onto one of the substrate carriers 1a or 1b of first substrate handler 1 and additionally to apply from the respective substrate carrier 1b or 1a of handler 1 a yet untreated substrate via the load lock 35 to the substrate transport arrangement 30.

As may be seen from FIG. 3 there is further provided a third substrate handler 50 in a specific embodiment of the apparatus according to the invention. This third substrate handler 50, again with an eye on FIGS. 2b to 2f, operates as source and destination location 7. As according to the addressed FIGS. 2b to 2f at this location 7 there is loaded an untreated substrate from such location 7 and received a treated substrate there in the rhythm at which first substrate handler 1 handles substrates, the handler 50 is operated at the same step-controlling clock as the first substrate handler 1. Third substrate handler 50 thus removes from a respective one of the substrate carriers 20 a treated substrate and applies to the same an untreated substrate. The third substrate handler 50 is swiveled about an axis $A_{50}$, preferably arranged parallel to the axes $A_1$, $A_{20}$, $A_{30}$ and is conceived as a two-arm handler in analogy to the substrate handler 1. The controlled swiveling drive for the third substrate handler 50 is addressed by reference number 52 in FIG. 3 with control input $C_{52}$.

As further shown in FIG. 3 there is provided a one-directional conveyor arrangement 54 with inline substrate support areas 56. The one-directional conveyor 54 is stepwise moved forwards as shown by the arrow v, so that whenever a substrate carrier 50a or 50b of the third substrate handler 50 registers with one of the substrate carriers 20a to 20c of the second substrate handler 20, the other one of the two substrate carriers 50a, 50b registers with one of the substrate supports 56 upon the conveyor 54. In this position an untreated substrate arriving from $E_{in}$ on a substrate support 56 is gripped by one of the substrate carriers 50a or 50b and subsequently, after a 180° swiveling step of the third substrate handler 50, a treated substrate is released and placed on the substrate support 56 which has just been freed. By a next step of the one-directional carrier 54 the treated substrate is moved in synchronism with transport arrangement 30.

With respect to the conception of the third substrate handler 50 with respect to geometric arrangement of its axis $A_{50}$ and as a two-armed handler etc. the same advantages are achieved as were already addressed in context with the specific arrangement of first substrate handler 1. The substrate carriers 50a and 50b of the third substrate handler 50 are equipped with substrate gripping members as at these substrate carriers the substrates are to be held in suspended position.

As perfectly clear to the skilled artisan principally it is possible to deliver treated substrates to a conveyor in analogy to conveyor 54 of FIG. 3 and to apply untreated substrates from such conveyor directly to and from the second substrate handler 20. Nevertheless, the three-handler concept as exemplified combined with the load lock on top of the vacuum treatment recipient 10 has the advantage that upon the multi-substrate carrier conveyor 54 substrates may just be deposited.

The apparatus as shown especially in FIG. 3, possibly with different types of third substrate handler 50 as will be addressed later, allows utmost flexible conception for more complex substrate treatment apparatus.

Figure 5:
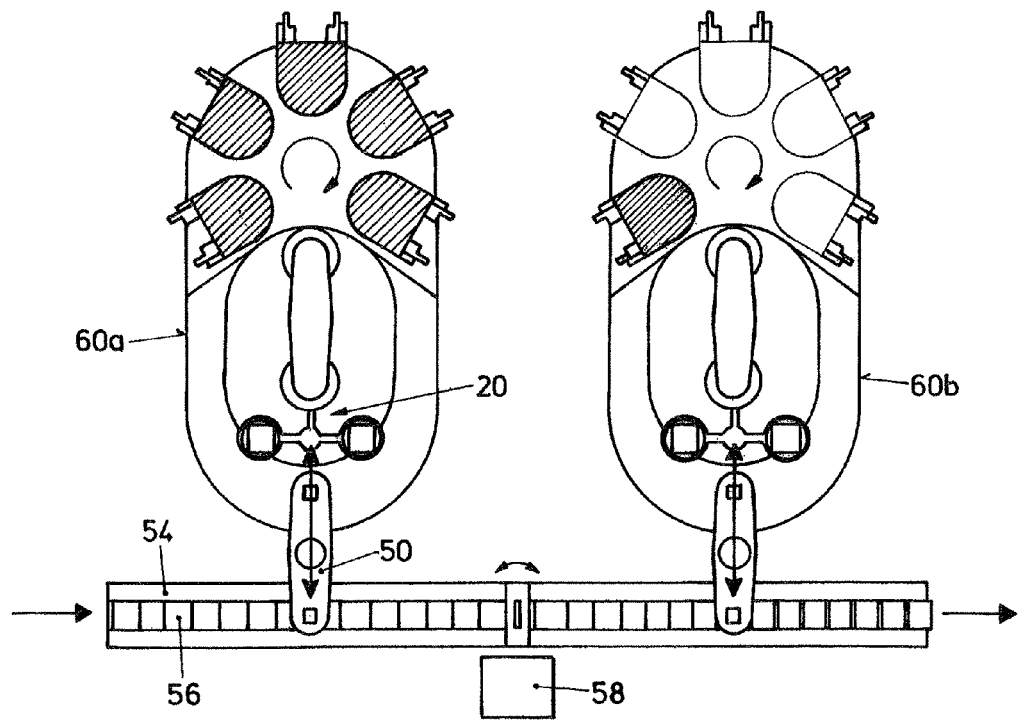
FIG. 5 an enlarged apparatus according to the present invention in one embodiment, making use of two of the apparatuses as shown in the FIGS. 3 and 4.

In the embodiment as shown in FIG. 5 substrates are to be treated on both surfaces. To do so first apparatus 60a according to the embodiment of FIG. 3 is provided along the one-directional conveyor 54. As exemplified by the five hatched treatment stations at the apparatus 60a the front surface of the substrates is treated by five equal or different processing or treatment steps. After the one side treated substrates are re-deposited by the third substrate handler 50 on the conveyor 54 they are stepwise moved forwards towards a flip station 58. At this flip station 58 the substrates are flipped so that their yet untreated surface is pointing upwards. The flipped-over substrates are then transported to a second apparatus 60b conceived as was explained in context with FIG. 3. There the backside of the substrates is treated. As such backside treatment may e.g. necessitate only one surface treatment or processing step at the apparatus 60b and as shown by respective hatching, only one of the treatment stations is operative or only one of such treatment stations is at all mounted. The substrates with surface treated backside are re-deposited upon the conveyor 54, so that downstream apparatus 60b substrates are stepwise transported which are treated on both, front surface and back surface.

Clearly and still with an eye on the embodiment of FIG. 5 one and the same surface of the substrate may be treated by totally ten processing steps, namely of apparatus 60a plus of apparatus 60b without providing the flipping station 58.

Figure 6:
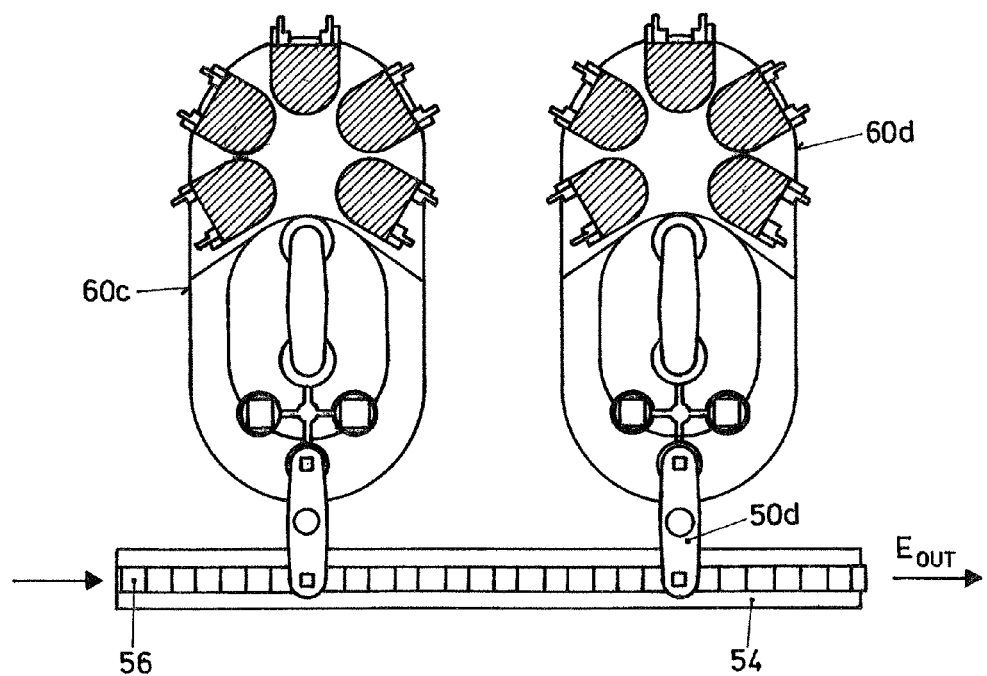
FIG. 6 in a representation in analogy to that of FIG. 5, a further embodiment of an enlarged treatment apparatus.

FIG. 6 shows a further example of flexibly combining apparatus according to the present invention to more complex multi-apparatus arrangements. With the embodiment of FIG. 6 parallel processing of substrates is established, which leads to doubling the throughput at the output end $E_{out}$ of conveyor 54. In a first apparatus 60$_c$ according to the invention every second workpiece support 56 of conveyor 54 is emptied from an untreated substrate, and a treated substrate is re-applied to the yet emptied workpiece support 56. To do so the conveyor 54 is stepwise advanced by an extent according to two subsequent substrate supports 56, each time an untreated substrate has been replaced by a substrate having been treated in apparatus 60$_c$. Upstream a second apparatus 60$_d$ identical to apparatus 60$_c$ is provided along the conveyor 54. The spacing of the two apparatus 60$_c$ and 60$_d$ is established so that the second apparatus 60$_d$ with its third substrate handler 50$_d$ registers with an untreated substrate on the conveyor 54 when the first apparatus 60$_c$ with its third substrate handler 50$_c$ registers as well with an untreated substrate on the conveyor 54. The apparatus 60$_d$ is thus loaded in parallel to the apparatus 60$_c$ with an untreated substrate from the substrate carrier 54 and respectively re-applies a treated substrate back to the just freed substrate support 56 simultaneously with apparatus 60$_c$ doing so. As the conveyor 54 is advanced at double speed the output of treated substrates at $E_{out}$ is doubled due to the addressed parallel processing.

Instead of conceiving the overall apparatus for single substrate handling and thereby conveying on the respective conveyors 54 as exemplified in the FIGS. 3, 5 and 6 single substrates, in a further embodiment substrate handling is performed in a cassette-to-cassette technique.

Figure 7:
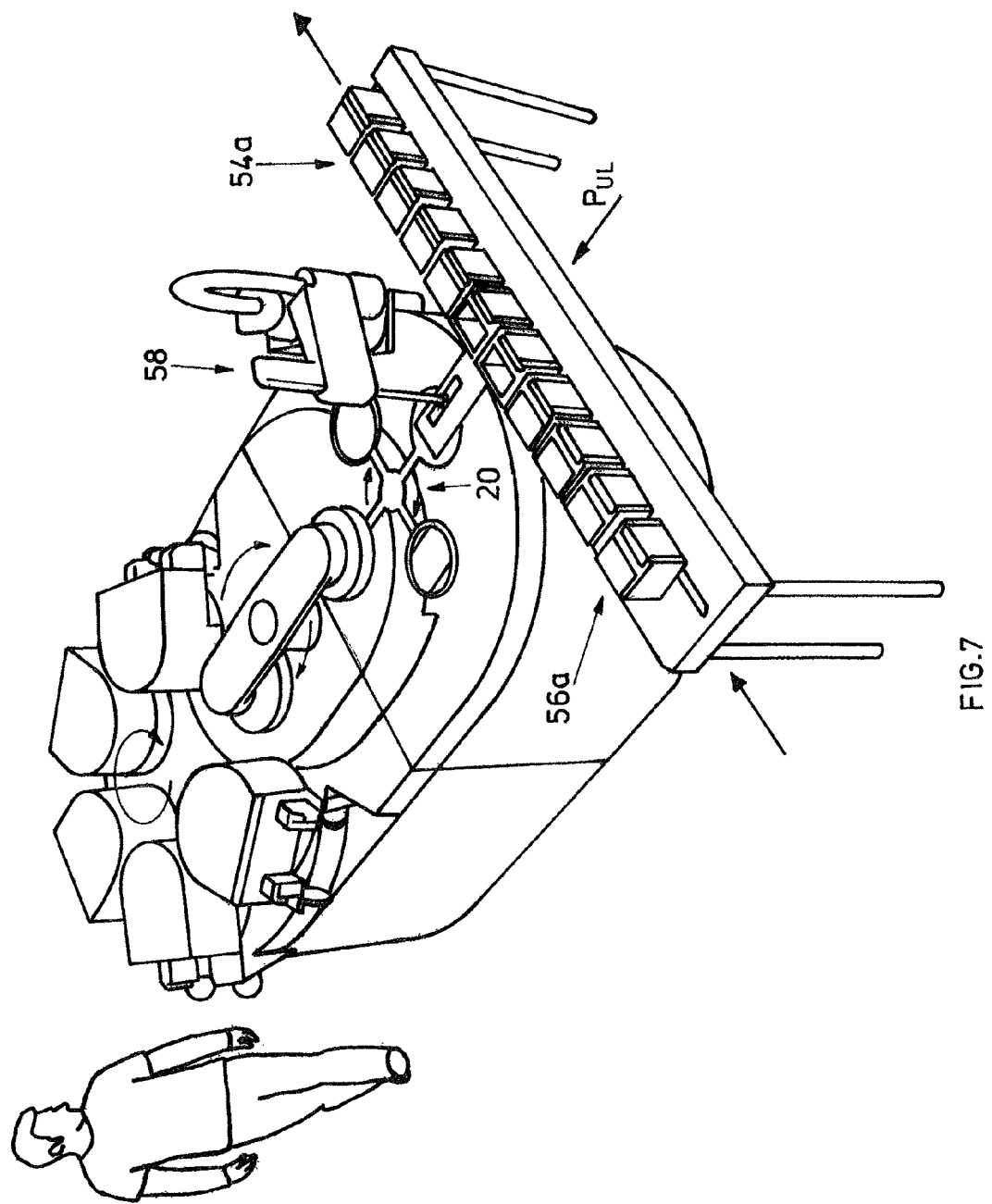
FIG. 7 in a perspective view, an apparatus according to the present invention and similar to the apparatus according to the FIGS. 3 and 4 for cassette-to-cassette substrate handling, and FIGS. 8a-8c a schematic representation of an apparatus according to the present invention for different substrate treatments and accordingly with different treatment station configurations.

According to FIG. 7 and with an eye e.g. on FIG. 3 there is provided instead of a single-substrate transport conveyor 54 a cassette-transport conveyor 54a wherein instead of single wafer supports 56 cassette or magazine supports 56a are provided. Full cassettes with untreated substrates are fed in arrow direction stepwise towards unload position $P_{ul}$. The cassette with untreated substrates is unloaded by means of a pivot robot 58 onto the second substrate handler 20 and treated substrates are unloaded from the second substrate handler 20 and loaded in a next upstream cassette by handler 58. Stepwise forwards movement of the conveyor 54a is only performed after that a cassette with untreated substrates is emptied and, accordingly, the next upstream cassette is full with the respective number of treated substrates. Clearly a cassette-to-cassette handling might also be performed with an eye e.g. on FIG. 3 by means of a two-armed handler 50, thereby moving the conveyor 54a with cassettes forth and back to subsequently empty one cassette with untreated substrates and filling the upstream neighboring cassette with treated substrates.

Figure 8A:
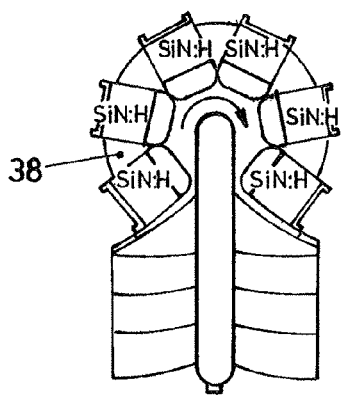
Figure 8B:
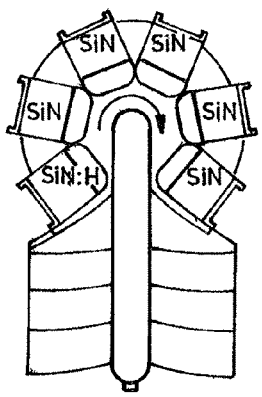
Figure 8C:
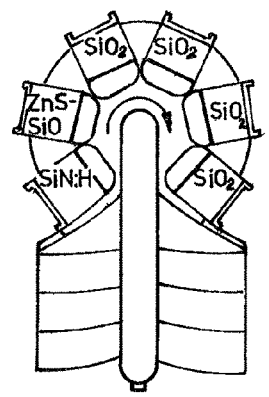

The apparatus according to the present invention is especially tailored today to treat substrates as silicon wafers for solar cell production. Thereby and with an eye e.g. on FIG. 5 for depositing a layer which has triple thickness of subsequent layers, three subsequent treating stations are operated equally and such triple thickness layer is deposited in fact by subsequently depositing one third of the layer in three equally operated subsequent treating stations. Thus, with the apparatus according to the present invention substrate surface treatment may be performed highly flexibly, whereby all the treatment steps are subdivided in sub-processes of equal time duration. The addressed apparatus has a minimum footprint at optimized throughput. It has to be noted that all handling facilities are easily accessible from outside the vacuum treatment recipient, obviously with the exception of the transport arrangement 30 within such recipient. Substrates e.g. of circular or square design may easily be treated especially of more than 200×200 mm. Clearly and with respect to the number of treatment stations as of 38 of FIG. 3 the number of such treatment stations may be more or less than five as shown in FIG. 3 as an example. By establishing processing in six treatment stations 38 according to FIG. 8a a thick layer of SiN:H may be deposited on silicon wafers by performing six times the equal layer deposition, e.g. by plasma-enhanced CVD or reactive PVD (sputtering). According to the embodiment of FIG. 8b a relatively thin layer of SiN:H is deposited and upon such relatively thin layer a further layer of SiN with approximately five times the thickness of the SiN:H layer. With the embodiment as schematically shown in FIG. 8c first a relatively thin layer of SiN:H is deposited, then due to higher deposition rate, a relatively thick layer of ZnS—SiO$_2$ followed by a relatively thick layer of SiO$_2$ in 4 substeps. Subdividing single unitary processing steps into substeps being performed subsequently at subsequent treatment stations is clearly performed taking into consideration the respective treatment rate of the addressed processes upon the substrate surface.

The invention claimed is:

1. A vacuum treatment apparatus comprising:
   a vacuum treatment recipient comprising a bi-directional load lock for substrate transfer between an interior of said recipient and an exterior of said recipient, said load lock comprising an external valve arrangement between a compartment of said load lock and said exterior and an internal valve arrangement between said compartment and said interior; and
   a first transport arrangement in said exterior for bi-directionally transporting substrates towards and from said load lock comprising:
      a first substrate handler, swivelable about a first axis, comprising at least two first substrate carriers equally radially spaced from said first axis; and
      a second substrate handler, swivelable about a second axis, comprising at least four second substrate carriers equally radially spaced from said second axis,
      wherein said first substrate carriers are configured to swivel along a first swiveling trajectory path, wherein said path comprises a first position and a second position, wherein when one of said first substrate carriers is in said first position, another of said first substrate carriers is in said second position, wherein each of said first substrate carriers is configured to be aligned with one of said second substrate carriers when in said first position, and wherein each of said first substrate carriers is configured to be aligned with said load lock when in said second position, wherein, when in said second position, each of said first substrate carriers is further configured to be movable towards and from said vacuum treatment recipient once aligned with said load lock to seal off said compartment from said exterior, thereby forming said external valve arrangement.

2. The vacuum treatment apparatus according to claim 1, wherein said load lock has a serving opening towards said exterior which is located in a top side wall portion of said vacuum treatment recipient.

3. The vacuum treatment apparatus of claim 1, wherein said first axis, said second axis, and a direction of movability of said first substrate carriers towards and from said vacuum treatment recipient are parallel.

4. The vacuum treatment apparatus according to claim 1, wherein said vacuum treatment recipient comprises at least two mounting locations each configured for a treatment station for treating a single substrate, wherein said vacuum treatment apparatus further comprises a third substrate handler, swivelable about a third axis, said third substrate handler comprising at least two third substrate carriers equally radially spaced from said third axis.

5. The vacuum treatment apparatus of claim 4, wherein said third axis is parallel to said first axis.

6. The vacuum treatment apparatus of claim 4, further comprising a one-directional conveyor configured to transport substrates to and from said vacuum treatment apparatus.

7. The vacuum treatment apparatus of claim 6, wherein said third substrate handler is configured to move substrates from said one-directional conveyor to said second substrate handler and from said second substrate handler to said one-directional conveyor.

8. An enlarged vacuum treatment apparatus comprising at least two of said vacuum treatment apparatus according to claim 6 along said one-directional conveyor.

9. The vacuum treatment apparatus of claim 4, wherein a third controlled drive is configured to swivel said third substrate handler about said third axis.

10. The vacuum treatment apparatus of claim 9, wherein a timing unit is configured to control said third controlled drive.

11. The vacuum treatment apparatus of claim 1, further comprising a one-directional conveyor configured to transport substrates to and from said vacuum treatment apparatus.

12. An enlarged vacuum treatment apparatus comprising at least two of said vacuum treatment apparatus according to claim 11 along said one-directional conveyor.

13. The enlarged vacuum treatment apparatus of claim 12 comprising a flip station between at least two of said vacuum treatment apparatus arranged along said one-directional conveyor for turning substrates on said one-directional conveyor upside down.

14. A system for treating substrates of at least 200 mm×200 mm, comprising:
the vacuum treatment apparatus according to claim 1.

15. A system for manufacturing solar cells, comprising:
the vacuum treatment apparatus of claim 1.

16. The vacuum treatment apparatus of claim 1, wherein a first controlled drive is configured to swivel said first substrate handler about said first axis, and wherein a second controlled drive is configured to swivel said second substrate handler about said second axis.

17. The vacuum treatment apparatus of claim 16, wherein a timing unit is configured to control at least one of said first controlled drive and said second controlled drive.

18. The vacuum treatment apparatus of claim 1, wherein a fourth controlled drive is configured to move said first substrate carriers towards and from said vacuum treatment recipient to seal off said compartment from said exterior.

19. The vacuum treatment apparatus of claim 18, wherein said fourth controlled drive comprises individual fourth controlled drives each of which is associated with one of said first substrate carriers and each of which is configured to independently move said one of said first substrate carriers towards and from said vacuum treatment recipient to seal off said compartment from said exterior.

20. A vacuum treatment apparatus comprising:
a vacuum treatment recipient comprising a bi-directional load lock for substrate transfer between an interior of said recipient and an exterior of said recipient, said load lock comprising an external valve arrangement between a compartment of said load lock and said exterior and an internal valve arrangement between said compartment and said interior; and a first transport arrangement in said exterior for bi-directionally transporting substrates towards and from said load lock comprising:
a first substrate handler, swivelable about a first axis, comprising at least two first substrate carriers equally radially spaced from said first axis; and
a second substrate handler, swivelable about a second axis, comprising at least four second substrate carriers equally radially spaced from said second axis,
wherein said first substrate handler is configured to swivel along a first swiveling trajectory path, wherein said path comprises a first position and a second position, wherein when said first substrate handler is in said first position, one of said first substrate carriers is aligned with said load lock and another of said first substrate carriers is aligned with one of said second substrate carriers, and wherein, when said first substrate handler is in said second position, the one of said first substrate carriers is aligned with one of said second substrate carriers and the other of said first substrate carriers is aligned with said load lock, wherein, said first substrate carriers are further configured to be movable towards and from said vacuum treatment recipient once aligned with said load lock to seal off said compartment from said exterior, thereby forming said external valve arrangement.

* * * * *